United States Patent

Yamashita et al.

[15] 3,665,262

[45] May 23, 1972

[54] SEMICONDUCTOR PRESSURE-ELECTRIC TRANSDUCER INCLUDING A SEMICONDUCTOR ELEMENT HAVING A DEEP LEVEL IMPURITY AND A SEMICONDUCTOR PRESSURE TRANSMITTING PLATE

[72] Inventors: Akio Yamashita, Ikeda-shi; Tadashi Yamada, Suita-shi, both of Japan

[73] Assignee: Matsushita Electric Industrial Co., Ltd., Osaka, Japan

[22] Filed: July 14, 1969

[21] Appl. No.: 841,281

[30] Foreign Application Priority Data

July 19, 1968 Japan..................................43/51417

[52] U.S. Cl....................317/234 R, 317/234 M, 317/235 U, 179/110, 338/2

[51] Int. Cl..........................................H01l 3/00, H01l 5/00

[58] Field of Search........................338/2; 317/235; 179/110

[56] References Cited

UNITED STATES PATENTS

| | | | |
|---|---|---|---|
| 3,518,508 | 6/1970 | Yamashita et al. | 317/235 |
| 3,277,717 | 10/1966 | Yerman | 317/235 |
| 3,414,779 | 12/1968 | Bohm | 317/235 |
| 3,414,832 | 12/1968 | Newell | 317/235 |

*Primary Examiner*—John W. Huckert
*Assistant Examiner*—Andrew J. James
*Attorney*—Stevens, Davis, Miller & Mosher

[57] ABSTRACT

In a semiconductor pressure-electric transducer comprising a semiconductor element which contains a deep level impurity and whose electric resistance varies with a pressure applied thereto, a structure of the plate for transmitting a pressure applied to said transducer to said semiconductor element.

1 Claims, 1 Drawing Figure

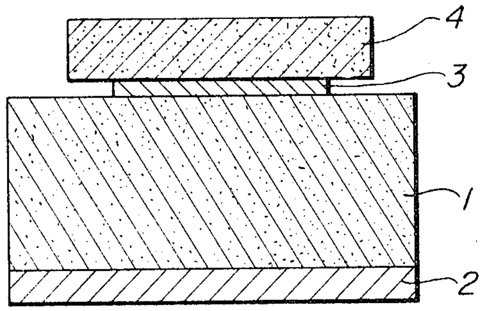
A. YAMASHITA &
T. YAMADA
INVENTORS
BY Stevens, Davis, Miller & MOSHER
ATTORNEYS

SEMICONDUCTOR PRESSURE-ELECTRIC TRANSDUCER INCLUDING A SEMICONDUCTOR ELEMENT HAVING A DEEP LEVEL IMPURITY AND A SEMICONDUCTOR PRESSURE TRANSMITTING PLATE

This invention relates to a semiconductor pressure-electric transducer utilizing a semiconductor element which contains a deep level impurity and whose electric resistance varies in response to the pressure applied thereto, and particularly to the structure of the pressure transmitting plate in such a transducer.

Semiconductor elements whose electric resistance varies in response to the pressure applied thereto are conventionally known in devices such as the strain gauge utilizing a Ge thin film, the pressure sensing cartridge utilizing a Si element and the pressure detector having a p-n junction. However, none of these devices utilizes an element containing a deep level impurity.

The present inventors have clarified the face that the electric resistivity of a semiconductor element containing a deep level impurity exhibits a high sensitivity to a pressure applied thereto. Such a high sensitivity makes it possible to produce a significant change in the electric resistance of the element even by pressing it with a flat plate. Thus, the stable operation of a pressure-sensitive element is ensured by forming the pressure applying means with a flat plate; and the present inventors have found it is especially advantageous to form such a flat plate of a semiconductor plate having a level different from that which the pressure-sensitive element had before the addition of the deep level impurity or the surface level of said element after the addition of said impurity and having a hardness nearly equal to that of said element.

Semiconductor pressure-electric transducers of the above-mentioned type have a very simple structure and are outstandingly stable in operation. Therefore, they will find many uses in industry, for example, as solid state switches, pressure detectors and acoustic elements.

Objects and features of this invention will be clarified by the following description given in connection with an embodiment of the invention and with reference to the accompanying drawing.

The drawing shows an elevation, of an embodiment of the semiconductor pressure-electric transducer of this invention.

In the drawing, reference numeral 1 indicates a semiconductor element which contains a deep level impurity such as Cu, Au or Ni and whose electric resistance varies according to the pressure applied thereto, 2 an ohmic electrode attached to the semiconductor element, 3 a rectifying contact electrode and 4 a pressure transmitting plate placed on the rectifying contact electrode 3 for conveying an external pressure to the semiconductor element 1, said plate 4 being formed of a semiconductor plate having a level different from that of the element 1 before the addition of the deep level impurity or the surface level of said element 1 after the addition of said impurity and having a hardness nearly equal to that of said element 1.

Hereunder, the above embodiment will be described in more detail. The semiconductor element 1 is manufactured by adding a deep level impurity such as Cu, Au, Co, Fe or Ni to a monocrystal of silicon. Then, electrodes 2 and 3 are provided on the opposite main surfaces of the element 1. Upon the upper electrode 3 is placed a plate 4 of silicon, monocrystal or polycrystal, which has a level of opposite polarity to that which the element 1 had before the addition of the deep level impurity. For example, if the level of the element 1 was an n-type before addition of the impurity, a p-type silicon plate is used for the pressure-transmitting plate 4. Or, if the surface level of the element has been changed to for example, a p-type as a result of the addition of the deep level impurity, a silicon plate of the n-type is used for the plate 4. The bottom surface of the plate 4 may be finished by polishing or by lapping. Thus, by applying a pressure to the element 1 through such a semiconductor plate 4, the electric resistance of the element 1 can be controlled by the applied pressure.

As described above, the pressure-electric transducer of this invention is constructed so that the pressure-sensitive element receives pressure through a semiconductor plate having a level different from that which the pressure-sensitive element had before the addition of the deep level impurity or the surface level of said element after the addition of said impurity. With such a structure, it is not required to use a semiconductor element of any special formation such as the mesa type. Further, the upper electrode 3 can be made extremely thin, for example, it may be formed by evaporation, without any danger of the occurrence of a leakage current. Because, if the plate 4 happens to contact with the element 1, it will be a p-n junction and the direction in which the leakage current flow is always opposite to the direction in which the pressure sensing function of the element 1 appears. Moreover, the fact that the hardness of the pressure-applying plate is nearly equal to that of the pressure-sensitive element, is advantageous for prolonging the mechanical operating life of the device. In short, a simple, economical and stable pressure-electric transducer is obtained according to this invention.

In the above embodiment, silicon is used for the pressure-sensitive element. However, it will be understood that other semiconductors such as Ge, GaAs, Gap, InAs and CdSe can be used with deep level impurity added thereto. Though silicon is also used for the pressure-transmitting plate in the above embodiment, it will be needless to say that a similar result is obtained using a semiconductor such as GaP, Ge, InAs or CdS which will make a contact junction of the same rectifying direction as that with the pressure-sensitive element. As to electric connections, at least one rectifying contact electrode is necessary, any additional number of such contacts being permissible. One ohmic contact electrode is sufficient when used with a DC circuit, while both electrodes must be rectifying contact when used with an AC circuit.

What is claimed is:

1. A pressure-electric transducer comprising a semiconductor element which contains an impurity producing (a) deep energy levels and the electric resistance of which varies with a pressure applied thereto, an electrode in rectifying contact with said element, and a semiconductor plate provided on said electrode for transmitting a pressure applied to said transducer, said semiconductor plate having a hardness nearly equal to that of said semiconductor element and having a contact rectifying characteristic with respect to said electrode which is in the same direction as that of said electrode to said pressure sensitive semiconductor element.

* * * * *